United States Patent
Kono

(10) Patent No.: US 6,707,758 B2
(45) Date of Patent: Mar. 16, 2004

(54) SEMICONDUCTOR MEMORY DEVICE INCLUDING CLOCK GENERATION CIRCUIT

(75) Inventor: Takashi Kono, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/234,240

(22) Filed: Sep. 5, 2002

(65) Prior Publication Data

US 2003/0174575 A1 Sep. 18, 2003

(30) Foreign Application Priority Data

Mar. 14, 2002 (JP) ........................................ 2002-070449

(51) Int. Cl.[7] ................................................ G11C 8/00
(52) U.S. Cl. ................... 365/233; 365/194; 365/189.04
(58) Field of Search ................................. 365/233, 194, 365/189.01, 189.04, 189.07, 190

(56) References Cited

U.S. PATENT DOCUMENTS 6,400,643 B1 * 6/2002 Setogawa .................... 365/233

FOREIGN PATENT DOCUMENTS

JP 11-17529 1/1999

* cited by examiner

Primary Examiner—Thong Le
(74) Attorney, Agent, or Firm—McDermott, Will & Emery

(57) ABSTRACT

A DLL circuit generates first and second internal clocks delayed by appropriate quantities from an external clock, and generates third and fourth internal clocks capable of driving a data output circuit after a CAS latency from the first and second internal clocks on the basis of an internal signal. A repeater recovers signal levels of the third and fourth internal clocks and outputs the third and fourth internal clocks as DLL clocks. The data output circuit takes in read data using the DLL clocks outputted from the repeater, and outputs the read data to an outside in a half cycle synchronously with the DLL clocks. In this way, a circuit area of a semiconductor memory device can be reduced by generating the DLL clocks in a prior stage to the data output circuit.

11 Claims, 11 Drawing Sheets

SEMICONDUCTOR MEMORY DEVICE INCLUDING CLOCK GENERATION CIRCUIT

BACKGROUND OF THE INVENTION

1. Field of the Invention

The present invention relates to a semiconductor memory device, and more particularly to a semiconductor memory device including a clock generation circuit which operates synchronously with the rise and fall of an external clock and which generates an internal clock signal synchronized with the external clock.

2. Description of the Background Art

Generally, an SDRAM (Synchronous Dynamic Random Access Memory) which operates synchronously with an external clock includes therein a clock generation circuit which generates an internal clock signal synchronized with the external clock. The Internal circuits of the SDRAM are controlled using this internal clock.

That is, a circuit which controls data input/output so that the SDRAM exchanges data with the outside of the SDRAM is controlled using this internal clock. Due to this, data input/output timing is greatly influenced by the phase accuracy of the internal clock.

Meanwhile, a DDR SDRAM (Double Data Rate SDRAM) which inputs and outputs data synchronously with the rising edge and the falling edge of an external clock has been developed and put to practical use so as to meet demand for operating a semiconductor device with high frequency. In the DDR SDRAM, the phase difference between the edge of the external clock and the data input/output timing of the DDR SDRAM is particularly required to be smaller than the phase difference in the normal SDRAM. This is because the DDR SDRAM inputs and outputs data at the double frequency rate of the frequency rate of normal SDRAM and the phase difference between the edge of the external clock and the data input/output timing is relatively large to the cycle of the external clock.

FIG. 10 is a timing chart showing data output timing at which data is read from the DDR SDRAM referred to as "DDR-I". In the DDR SDRAM, a CAS latency CL is set at 2.5 and a burst length BL is set at 4. The CAS latency represents the number of cycles (note that one cycle is from the rise of an external clock EXTCLK to the next rise thereof) since the DDR SDRAM receives a READ command (a command to read data) from the outside until the read data is outputted to the outside of the DDR SDRAM. In addition, the burst length represents the number of bits continuously read in response to the READ command.

Referring to FIG. 10, the DDR SDRAM outputs data DQ, which is read data, and a data strobe signal DQS synchronously with external clocks EXTCLK and EXT/CLK. External clock EXT/CLK is a complementary clock signal to external clock EXTCLK. In addition, data strobe signal DQS is a signal which is used as timing at which an external controller receiving data DQ takes in data DQ.

The timing difference tAC between the edge of each of external clocks EXTCLK and EXT/CLK and the output of data DQ is specified to fall within a certain range. In FIG. 10, timing difference tAC is controlled to be 0.

To realize data output shown in FIG. 10, a data output circuit needs an operating clock at timing slightly faster than that of the edge of external clock EXTCLK. This is because a delay is generated between the input of an external clock into a semiconductor memory device and the actual output of data from a semiconductor memory device, depending on the capacity of each internal circuit.

That is, external clock EXTCLK is a fixed-cycle signal, and internal clocks CLK_P and CLK_N which are delayed from external clock EXTCLK by an appropriate delay quantity Td and thereby shifted backward by appropriate time Ta from the edge of external clock EXTCLK are generated. It is, therefore, necessary to provide a clock generation circuit capable of controlling delay quantity Td so that data DQ outputted from a data output circuit and data strobe signal DQS outputted from a data strobe signal output circuit, both of which signals operate using internal clocks CLK_P and CLK_N as triggers, satisfy timing difference tAC. The circuit which generates such internal clock signals is referred to as a DLL (Delay Locked Loop) circuit.

The backward amount Ta is determined by propagation time for read data to be taken in using internal clocks CLK_P and CLK_N as triggers and then to be read out to the data output terminal, in a data output circuit. As shown in FIG. 10, if the CAS latency is 2.5, the first data of data DQ is outputted synchronously with the rising edge of EXT/CLK (the falling edge of EXTCLK). Therefore, the odd-numbered data of data DQ and the even-numbered data of data DQ are outputted to the outside of the semiconductor memory device using internal clock CLK_N as a trigger and internal clock CLK_P as a trigger, respectively.

FIG. 11 is a schematic block diagram for conceptually explaining the relationship between the above-mentioned DLL circuit and the data output circuit which operates with the internal clocks generated by the DLL circuit and which outputs data DQ to the outside of the semiconductor memory device.

Referring to FIG. 11, DLL circuit 100 generates and outputs an internal clock CLK_PF delayed from external clock EXTCLK and an internal clock CLK_NF delayed from external clock EXT/CLK. A repeater 120 receives internal clocks CLK_PF and CLK_NF and outputs DLL clocks CLK_P and CLK_N.

A plurality of data output circuits 500 are provided based on a word organization for DDR SDRAM. In FIG. 11, sixteen data output circuits 500 which output data DQ0 to DQ15, respectively, are provided. Each data output circuit 500 inputs DLL clocks CLK_P and CLK_N, is activated by one of DLL clocks CLK_P and CLK_N selected according to an internal signal NZPCNT which is set based on the CAS latency, takes in read data which is read from a memory cell array to a data bus, and outputs the read data to the outside of the semiconductor memory device.

Here, as shown in FIG. 11, a signal path from DLL circuit 100 to data output circuits 500 normally has a tree structure. Circuits and signal lines are arranged so as to prevent the data output timings of a plurality of data output circuit 500 from greatly differing among the circuits. Normally, one repeater 120 is arranged for eight or four data output circuits.

FIG. 12 is a functional block diagram for functionally explaining DLL circuit 100.

Referring to FIG. 12, DLL circuit 100 includes variable delay circuits 206 and 208, pulse generation circuits 210 and 212, an input/output replica circuit 214, a phase comparator 216 and a delay control circuit 218.

An input buffer 202, which receives external clocks EXTCLK and EXT/CLK inputted into the semiconductor memory device from the outside thereof and which outputs an internal clock BUFFCLK_DLL to DLL circuit 100, detects the intersection between a potential level when external clock EXTCLK rises and that when external clock EXT/CLK which is the inversion signal of external clock EXTCLK falls, and generates an internal clock BUFFCLK_DLL. On the other hand, an input buffer 204 detects the intersection between a potential level when external clock EXTCLK falls and that when external clock EXT/CLK rises, and generates an internal clock BUFF/CLK_DLL.

Variable delay circuit 206 delays internal clock BUFFCLK_DLL received from input buffer 202 and outputs the delayed clock to pulse generation circuit 210. Variable delay circuit 206 includes a plurality of delay units which generate delays, connects/disconnects the delay units based on a command from delay control circuit 218, and thereby delays internal clock BUFFCLK_DLL.

Pulse generation circuit 210 generates internal clock CLK_PF which serves as a pulse signal synchronized with the rising edge of the signal outputted from variable delay circuit 206.

Variable delay circuit 208 delays internal clock BUFF/CLK_DLL received from input buffer 204, and outputs the delayed clock to pulse generation circuit 212. Since the configuration of variable delay circuit 208 is equal to that of variable delay circuit 206, it will not be repeatedly described herein.

Pulse generation circuit 212 generates internal clock CLK_NF which serves as a pulse signal synchronized with the rising edge of the signal outputted from variable delay circuit 208.

Input/output replica circuit 214 reproduces, in a mimic manner, input buffer 202 and circuit characteristics from output of internal clocks CLK_PF and CLK_NF from DLL circuit 100 to output of data DQ to the data input/output terminal, and allocates, in a mimic manner, delay quantities generated by these circuits to internal clock CLK_PF.

Phase comparator 216 compares the phase of an internal clock FBCLK outputted from input/output replica circuit 214 with that of internal clock BUFFCLK_DLL after one or a few cycles, and generates control signals UP and DOWN for increasing/decreasing the delay quantities of variable delay circuits 206 and 208 based on the phase difference.

Delay control circuit 218 generates a delay control signal based on control signals UP and DOWN, outputs the generated delay control signal to variable delay circuits 206 and 208 and thereby adjusts the delay quantities of variable delay circuits 206 and 208. If the phase of internal clock BUFFCLK_DLL is consistent with that of internal clock FBCLK, phase comparator 216 does not output either control signal UP or DOWN, and the delay control signal becomes a fixed-value signal, thereby fixing the delay quantities of variable delay circuits 206 and 208.

As a result, internal clocks CLK_PF and CLK_NF become signals having phases advancing from those of external clocks EXTCLK and EXT/CLK by as much as the sum of the delay quantity from DLL circuit 100 to data output circuit 500 and the data output delay quantity of data output circuit 500. Therefore, if the delay quantity given by input/output replica circuit 214 is consistent with those of input buffer 202, repeater 120 and data output circuit 500, timing difference tAC mentioned above becomes 0.

On the other hand, if the phase of internal clock BUFFCLK_DLL is not consistent with that of internal clock FBCLK, phase comparator 216 outputs control signal UP or DOWN depending on the phase difference and variable delay circuits 206 and 208 connect/disconnect the delay units, thereby adjusting the respective delay quantities.

FIG. 13 is a circuit diagram showing the circuit configuration of repeater 120.

Referring to FIG. 13, repeater 120 is formed of inverters 1202 to 1208. Repeater 120 receives internal clock CLK_PF, and outputs DLL clock CLK_P through inverters 1202 and 1204. Repeater 120 also receives internal clock CLK_NF, and outputs DLL clock CLK_N through inverters 1206 and 1208.

FIG. 14 is a functional block diagram for functionally explaining data output circuit 500.

Referring to FIG. 14, data output circuit 500 includes amplification circuits 362 and 364, a parallel/serial conversion circuit 366, an output data latch circuit 302, an output driver circuit 304 and a clock select circuit 502.

In case of DDR-I mentioned above, data is read from the memory cell array in a cycle based on a 2-bit pre-fetch operation for reading data of two bits to each data output circuit by one read operation. That is, data of two bits is read from the memory cell array to data output circuit 500 in a cycle, data output circuit 500 orders the data of two bits and transfers the data in a half cycle and outputs the data to the outside of the memory.

Amplification circuit 362 operates in a cycle synchronously with a DLL clock CLKQ received from clock select circuit 502, amplifies data read from the memory cell array to a pair of data buses DB0 and /DB0, and. outputs the amplified data to parallel/serial conversion circuit 366. Similarly to amplification circuit 362, amplification circuit 364 operates in a cycle synchronously with DLL clock CLKQ, amplifies data read from the memory cell array to a pair of data buses DB1 and /DB1 at the same timing as that of reading data to data bus pair DB0 and /DB0, and outputs the amplified data to parallel/serial conversion circuit 366.

Parallel/serial conversion circuit 366, similarly to amplification circuits 362 and 364, operates in a cycle synchronously with DLL clock CLKQ, orders data of two bits, i.e., RD0 and /RD0 (which are complementary to each other and one-bit data) and data RD1 and /RD1 received from amplification circuits 362 and 364, respectively, and outputs ordered data to output data latch circuit 302.

Output data latch circuit 302 operates in a half cycle synchronously with a DLL clock CLKO received from clock select circuit 502, latches data RDD and /RDD received from parallel/serial conversion circuit 366, and transfers data /RDH and /RDL to output driver circuit 304 in a half cycle. Output driver circuit 304 outputs data DQi to the outside of the semiconductor memory device through data input/output terminal 18.

Clock select circuit 502 generates DLL clock CLKQ which activates amplification circuits 362 and 364 and parallel/serial conversion circuit 366 based on DLL clocks CLK_P and CLK_N. Clock select circuit 502 also generates DLL clock CLKO which activates output data latch circuit 302 based on DLL clocks CLK_P and CLK_N.

As described above, DDR-I has a two-bit pre-fetch configuration of transferring data of two bits read in one cycle, serially in a half cycle. Due to this, clock select circuit 502 needs to generate DLL clock CLKQ using either DLL clock CLK_P or CLK_N as an origin depending on initial data output timing.

To this end, clock select circuit 502, with consideration to the CAS latency which specifies the initial data output timing, selects either internal clock CLK_P or CLK_N based on internal signal NZPCNT which has different logic levels depending on whether the CAS latency is an integer or a half-integer, generates DLL clock CLKQ and outputs DLL clock CLKQ to amplification circuits 362 and 364 and parallel/serial conversion circuit 366, to thereby activate these circuits.

Further, clock select circuit 502 generates DLL clock CLKO which serves as a trigger for allowing output data latch circuit 302 to transfer data RDD and /RDD received from parallel/serial conversion circuit 366 to output driver circuit 304 one bit by one bit in a half cycle.

FIG. 15 is a circuit diagram showing the circuit configuration of clock select circuit 502.

Referring to FIG. 15, clock select circuit 502 includes AND gates 5022 and 5024, a NOR gate 5026, an inverter 5028 and an OR gate 5030.

Internal signal NZPCNT is a DC signal the level of which becomes L (logic Low) when the CAS latency is an integer and which becomes H (logic High) when the CAS latency is a half-integer. The CAS latency is set in advance based on a product specification. DDR SDRAM which operates at the operation timing shown in FIG. 10 has a CAS latency of 2.5. In this DDR SDRAM, the level of internal signal NZPCNT is fixed to H level and AND gate 5024 is activated. Therefore, DLL clock CLKQ corresponds to DLL clock CLK_N. In case of DDR SDRAM having a CAS latency of 2.0, DLL clock CLKQ corresponds to DLL clock CLK_P.

As can be seen, the DLL clock which activates data output circuit 500 is selected while considering the CAS latency, and data DQ is outputted to the outside at the timing of the timing chart shown in FIG. 10.

In FIG. 11, only repeaters 120 are provided between DLL circuit 100 and data output circuits 500. Because of its circuit characteristic, DLL circuit 100 cannot be arranged in the vicinity of data output circuits 500. If a path connecting DLL circuit 100 to data output circuits 500 is long, a buffer is often arranged between DLL circuit 100 and repeaters 120 so as to shape a signal waveform.

FIG. 16 is a schematic block diagram, which corresponds to that shown in FIG. 11, if a buffer is further provided between DLL circuit 100 and repeaters 120 in the configuration shown in FIG. 11.

Referring to FIG. 16, a buffer 125 is arranged on the path between DLL circuit 100 and repeaters 120, shapes the waveforms of internal clocks CLK_PF and CLK_NF outputted from DLL circuit 100, and outputs the clocks as internal clocks CLK_PB and CLK_NB, respectively.

Since the circuit configurations of DLL circuit 100, data output circuit 500 and repeater 120 are equal to those of the respective circuits shown in FIG. 11, they will not be repeatedly described herein.

FIG. 17 is a circuit diagram showing the circuit configuration of buffer 125.

Referring to FIG. 17, buffer 125 is formed of inverters 1252 to 1258 and is basically equal in configuration to repeater 120. Buffer 125 receives internal clock CLK_PF outputted from DLL circuit 100 and outputs internal clock CLK_PB through inverters 1252 and 1254. Buffers 125 also receives internal clock CLK_NF outputted from DLL circuit 100 and outputs internal clock CLK_NB through inverters 1256 and 1258.

It is necessary to provide clock select circuit 502 shown in FIG. 15 per data output circuit 500. Due to this, if a semiconductor memory device corresponds to a multi-bit structure, the circuit area of the data output circuit zone disadvantageously increases.

Further, as can be understood from the circuit configuration of dock select circuit 502 shown in FIG. 15, DLL clock CLKQ is delayed from DLL clocks CLK_P and CLK_N. Due to this, it is necessary to set the backward amount of the internal clock relative to external clock EXTCLK large, accordingly.

However, particularly in case of the DDR SDRAM which operates with high frequency, an internal clock generated by the DLL circuit is faster in timing than an external clock in a prior cycle, with the result that DLL clocks CLK_P and CLK_N cannot be appropriately generated from external clocks EXTCLK and EXT/CLK. It is, therefore, desirable that the backward amount of an internal clock relative to an external clock is as small as possible.

SUMMARY OF THE INVENTION

The present invention has been made to solve the above-mentioned disadvantages, and an object thereof to provide a semiconductor memory device which operates synchronously with the rise and fall of an external clock and which enables the reduction of a circuit area by generating an operation clock for driving a data output circuit in a prior stage to a data output circuit.

It is another object of the present invention to provide a semiconductor memory device which operates synchronously with the rise and fall of an external clock and which can reduce the backward amount of an internal clock relative to an external clock.

According to the present invention, a semiconductor memory device is a semiconductor memory device inputting and outputting data synchronously with rise and fall of an external clock, and includes: a memory cell array storing data; a clock generation circuit generating a first internal clock and a second internal clock corresponding to the rise and the fall of the external clock, respectively, synchronously with the external clock; at least one clock select circuit selecting one of the first and second internal clocks as a first operation clock and selecting the other one of the first and second internal clocks as a second operation clock in accordance with the number of cycles from receiving a command to read the data from the memory cell array until starting to output the read data read from the memory cell array to an outside; at least one signal recovery circuit recovering the signal outputted from the clock select circuit; and at least one data output circuit receiving the first and second operation clocks outputted from the signal recovery circuit, and outputting the read data to the outside synchronously with the first and second operation clocks.

Preferably, a plurality of the data output circuits are provided, each the at least one signal recovery circuit receives the first and second operation clocks from the clock select circuit, each of the plurality of data output circuits receives the first and second operation clocks from any the at least one signal recovery circuit, and the clock select circuit, the at least one signal recovery circuit and the plurality of data output circuits are provided in a hierarchical tree structure.

It is preferable that the clock select circuit is included in the signal recovery circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter in detail with reference to the drawings. It is noted that same or corresponding sections are denoted by the same reference symbols, respectively and will not be repeatedly described.

First Embodiment

Figure 1:
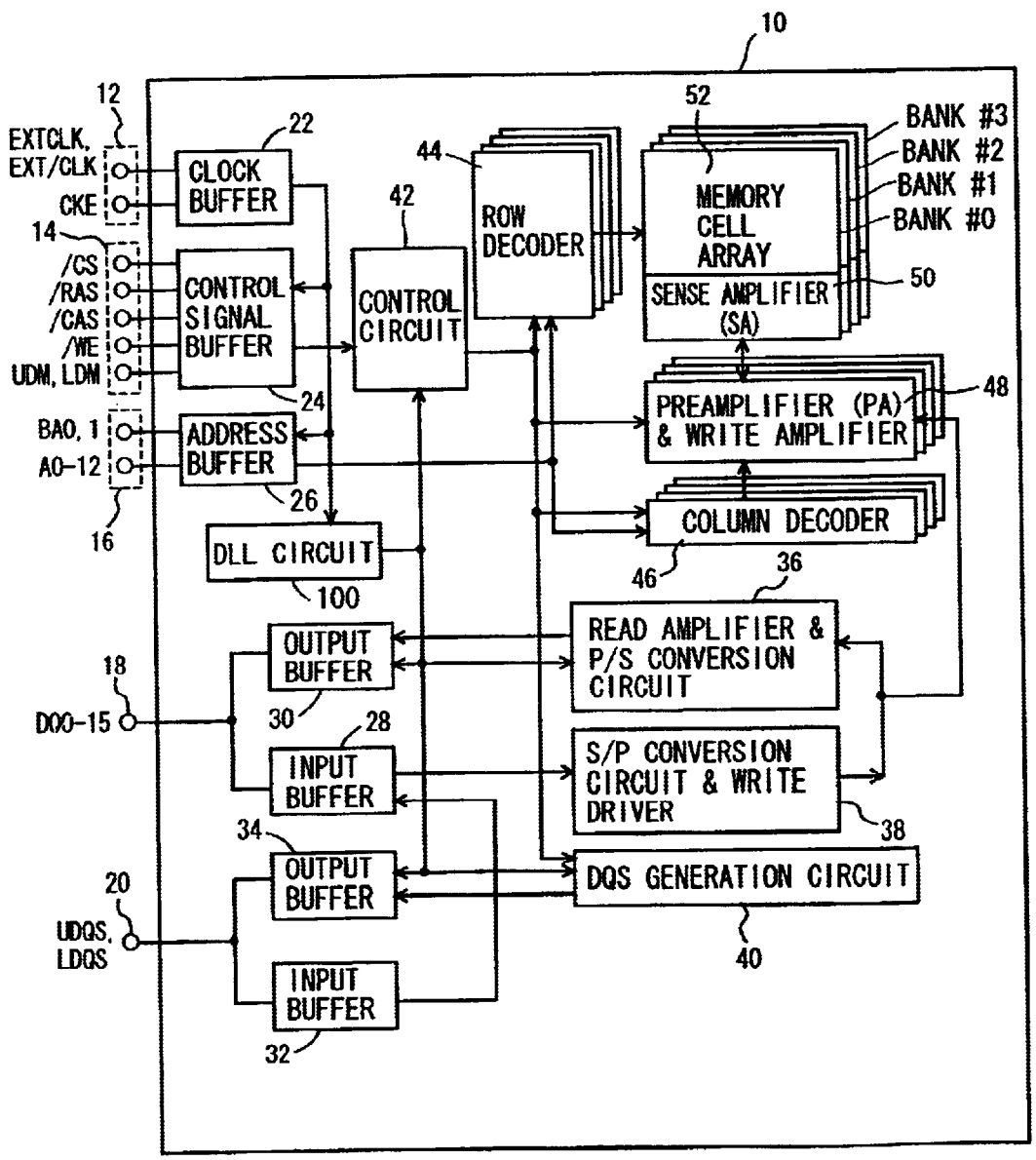
FIG. 1 is a schematic block diagram showing the overall configuration of a semiconductor memory device according to the present invention.

FIG. 1 is a schematic block diagram showing the overall configuration of a semiconductor memory device 10 in the first embodiment of the present invention.

Referring to FIG. 1, semiconductor memory device 10 includes a clock terminal 12, a control signal terminal 14, an address terminal 16, a data input/output terminal 18, and a data strobe signal input/output terminal 20.

Semiconductor memory device 10 also includes a clock buffer 22, a control signal buffer 24, an address buffer 26, an input buffer 28 and an output buffer 30 which are related to data DQ0 to DQ15, and an input buffer 32 and an output buffer 34 which are related to data strobe signals UDQS and LDQS.

Semiconductor memory device 10 further includes a read amplifier & P/S (parallel/serial) conversion circuit 36, an S/P (serial/parallel) conversion circuit & write driver 38, a DQS generation circuit 40 and a DLL circuit 100.

Semiconductor memory device 10 further includes a control circuit 42, a row decoder 44, a column decoder 46, a preamplifier & write amplifier 48, a sense amplifier 50 and a memory cell array 52.

It is noted that FIG. 1 typically shows the main parts of semiconductor memory device 10 related to data input/output.

Semiconductor memory device 10 has a two-bit pre-fetch configuration in which data of 2×n bits (where n is a bit width in the semiconductor memory device, and n=16 in semiconductor memory device 10) is read by one read operation in the cyclically reading of data from memory cell array 52. That is, in one cycle, data of 2 bits is read from memory cell array 52 for each of n data output circuits, each data output circuit orders the data of two bits, transfers the data in a half cycle and outputs the data to the outside of semiconductor memory device 10.

During data write, semiconductor memory device 10 takes in data of n bits (n=16) in a half cycle synchronously with the rise and fall of a data strobe signal, and writes data of 2 half cycles to memory cell array 52 in a cycle.

Clock terminal 12 receives external clock EXTCLK, external clock EXT/CLK complementary to external clock EXTCLK, and a clock enable signal CKE. Control signal terminal 14 receives command control signals such as a chip select signal /CS, a row address strobe signal /RAS, a column address strobe signal /CAS, a write enable signal /WE and input/output DQ mask signals UDM and LDM. Address terminal 16 receives address signals A0 to A12 and bank address signals BA0 and BA1.

Clock buffer 22 receives external clocks EXTCLK and EXT/CLK and clock enable signal CKE, generates an internal clock and outputs the internal clock to control signal buffer 24, address buffer 26 and DLL circuit 100. Control signal buffer 24 takes in and latches chip select signal ICS, row address strobe signal /RAS, column address strobe signal /CAS, write enable signal /WE and input/output DQ mask signals UDM and LDM synchronously with the internal clock received from clock buffer 22, and outputs these command control signals to control circuit 42. Address buffer 26 takes in and latches address signals A0 to A12 and bank address signals BA0 and BA1 synchronously with the internal clock received from clock buffer 22, generates an internal address signal and outputs the generated internal address signal to row decoder 44 and column decoder 46.

Data input/output terminal 18 is a terminal which exchanges data read and written in semiconductor memory device 10 with the outside of the device. During data write, data input/output terminal 18 receives data DQ0 to DQ15 inputted from the outside of the device. During data read, data DQ0 to DQ15 are outputted to the outside. Data strobe signal input/output terminal 20 receives data strobe signals UDQS and LDQS for reading data DQ0 to DQ15 from the outside during data write and outputs data strobe signals UDQS and LDQS for allowing an external controller to read data DQ0 to DQ15 during data read.

Input buffer 28 inputs data DQ0 to DQ15 synchronously with data strobe signals UDQS and LDQS which input buffer 32 receives from the outside.

Output buffer 30 operates synchronously with a DLL clock which is generated based on the internal clock generated by DLL circuit 100, and outputs data DQ0 to DQ15 to data input/output terminal 18 in a half cycle. Output buffer 34 takes in data strobe signals UDQS and LDQS generated by DQS generation circuit 40 which operates synchronously with the above-mentioned DLL clock, operates synchronously with the DLL clock together with output buffer 30 which generates data DQ0 to DQ15, and outputs data strobe signals UDQS and LDQS to data strobe input/output terminal 20.

Read amplifier & P/S conversion circuit 36 amplifies read data received from preamplifier & write amplifier 48, orders data of two bits read by one time as data DQi (i: 0 to 15) and outputs the data to output buffer 30 during data read. S/P conversion circuit & write driver 38 outputs data DQi received from input buffer 28 one bit by one bit in a half cycle to preamplifier & write amplifier 48 by two bits in parallel in a cycle during data write.

Control circuit 42 takes in the command control signals synchronously with the above-mentioned DLL clock, and controls row decoder 44, column decoder 46 and preamplifier & write amplifier 48 based on the taken in command control signals. As a result, data DQ0 to DQ15 are read or written from or to memory cell array 52. Control circuit 42 also controls the generation of the data strobe signals in DQS generation circuit 40 based on the taken in command control signals.

Memory cell array 52 which stores data is formed of four banks which can operate independently of one another, and data is read and written to and from memory cell array 52 through sense amplifier 50.

DLL circuit 100 generates and outputs internal clocks CLK_PF and CLK_NF delayed from external clock EXTCLK.

Internal clocks CLK_PF and CLK_NF outputted from DLL circuit 100 are converted into internal clocks CLK_FF and CLK_SF by a clock select circuit which is not shown in FIG. 1, based on a CAS latency which is set in semiconductor memory device 10.

The signal levels of internal clocks CLK_FF and CLK_SF are kept by a repeater which is not shown in FIG. 1 and internal clocks CLK_FF and CLK_SF are finally inputted, as DLL clocks, into output buffers 30 and 34, read amplifier & P/S conversion circuit 36, DQS generation circuit 40 and control circuit 42.

Figure 2:
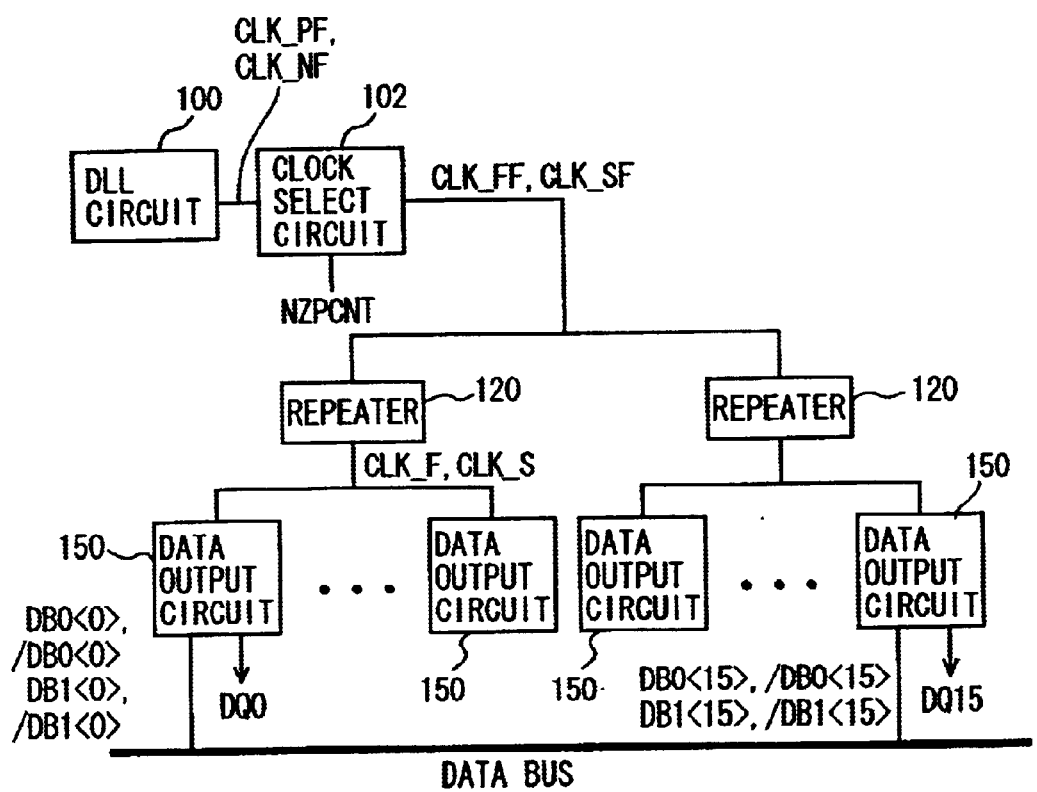
FIG. 2 is a schematic block diagram for conceptually describing the relationship between a DLL circuit and data output circuits in the semiconductor memory device according to a first embodiment.

FIG. 2 is a schematic block diagram for conceptually explaining the relationship between DLL circuit 100 and data output circuits which operate with the internal clocks generated by DLL circuit 100 and output data DQ to the outside.

Referring to FIG. 2, internal clocks CLK_PF and CLK_NF generated by DLL circuit 100 based on external clocks EXTCLK and EXT/CLK are inputted into clock select circuit 102.

Clock select circuit 102 is arranged between DLL circuit 100 and repeaters 120. Clock select circuit 102 receives internal clocks CLK_PF and CLK_NF outputted from DLL circuit 100, and generates internal clocks CLK_FF and CLK_SF for driving data output circuits 150 at appropriate timing based on the CAS latency set in semiconductor memory device 10.

That is, clock select circuit 102 selects either internal clock CLK_PF or CLK_NF in accordance with internal signal NZPCNT which has different logic levels depending on the CAS latency, and generates internal clock CLK_FF with consideration to the CAS latency which specifies the initial data output timing of the read data. Clock select circuit 102 also generates internal clock CLK_SF having a phase shifted by a half cycle from that of internal clock CLK_FF.

Specifically, if the CAS latency is a half-integer, clock select circuit 102 outputs internal clock CLK_NF as internal clock CLK_FF and outputs internal clock CLK_PF as internal clock CLK_SF. On the other hand, if the CAS latency is an integer, clock select circuit 102 outputs internal clock CLK_PF as internal clock CLK_FF and outputs internal clock CLK_NF as internal clock CLK_SF.

Repeater 120 receives internal clocks CLK_FF and CLK_SF and outputs DLL clocks CLK_F and CLK_S.

Specifically, data output circuit 150 is equivalent to read amplifier & P/S conversion circuit 36 and output buffer 30 shown in FIG. 1. Sixteen data output circuits 150 are provided to correspond to the word organization of semiconductor memory device 10. Each data output circuit 150 is driven by DLL clocks CLK_F and CLK_S, takes in read data read from memory cell array 52 shown in FIG. 1 from the data bus and outputs the taken in data to data input/output terminal 18 shown in FIG. 1.

As shown in FIG. 2, a signal path from DLL circuit to 100 data output circuits 150 has a tree structure. Repeaters 120 are arranged so as to prevent data output timing from greatly differing among a plurality of data output circuits 150. Normally, one repeater 120 is arranged for eight or four data output circuits. In FIG. 2, one repeater 120 is arranged for eight data output circuits 150.

Figure 3:
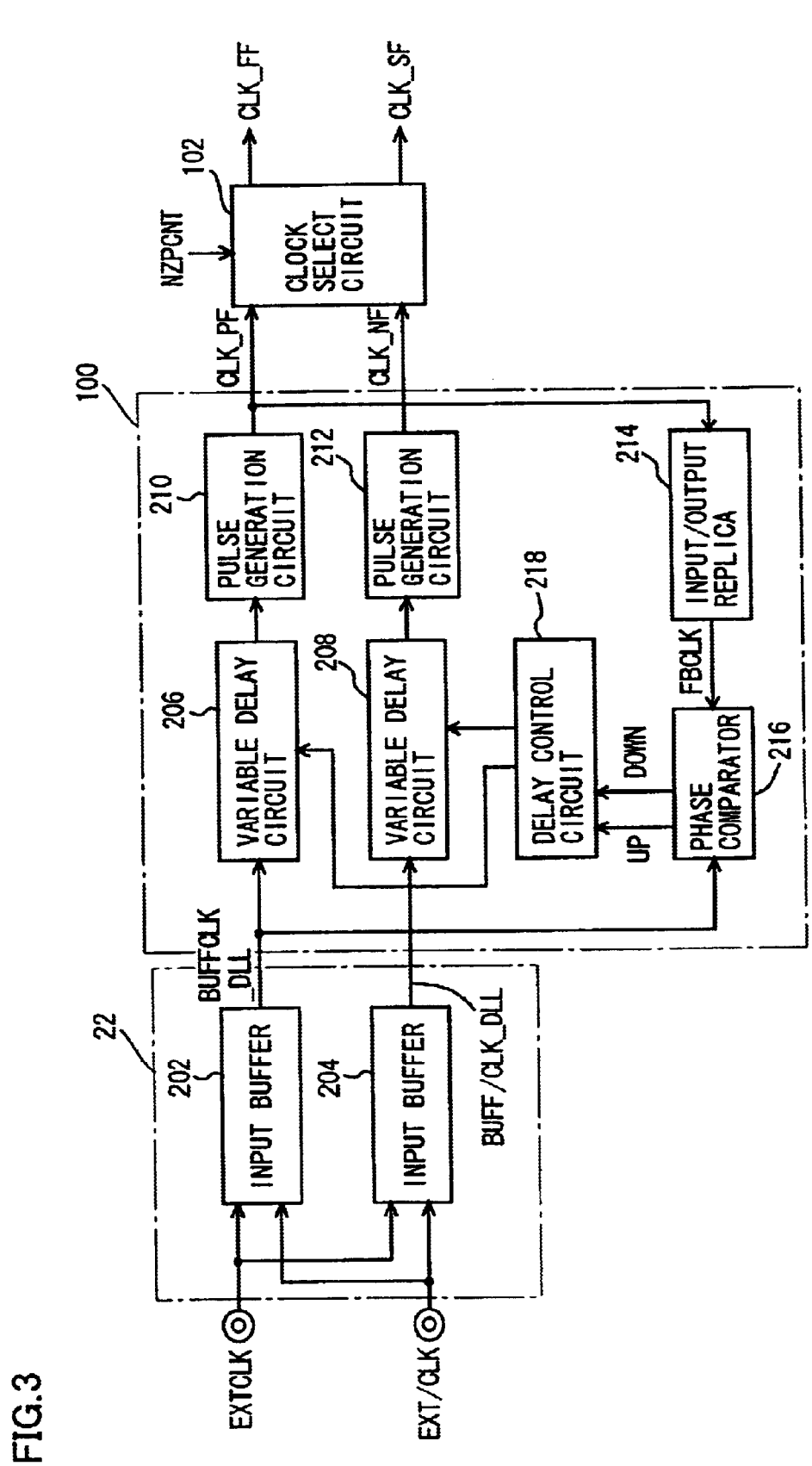
FIG. 3 is a functional block diagram for functionally describing the DLL circuit shown in FIG. 1.

FIG. 3 is a functional block diagram for functionally explaining DLL circuit 100.

Referring to FIG. 3, DLL circuit 100 includes variable delay circuits 206 and 208, pulse generation circuits 210 and 212, input/output replica circuit 214, phase comparator 216 and delay control circuit 218.

Clock buffer 22, which receives external clocks EXTCLK and EXT/CLK from the outside and which outputs an internal clock BUFFCLK_DLL and BUFF/CLK_DLL to DLL circuit 100, detects the intersection between a potential level when each of external clocks EXTCLK and EXT/CLK rises or falls, and generates internal clock BUFFCLK_DLL synchronized with external clock EXTCLK and internal clock BUFF/CLK_DLL synchronized with external clock EXT/CLK.

Variable delay circuit 206 includes a plurality of delay units which generate delays, and connect/disconnect the delay units based on a command from delay control circuit 218, thereby delaying internal clock BUFFCLK_DLL and outputting the delayed internal clock to pulse generation circuit 210. Pulse generation circuit 210 generates internal clock CLK_PF which serves as a pulse signal synchronized with the rising edge of the signal outputted from variable delay circuit 206, and outputs internal clock CLK_PF to clock select circuit 102 and input/output replica circuit 214.

Variable delay circuit 208, which has a configuration equal to that of variable delay circuit 206, delays internal clock BUFF/CLK_DLL, and outputs the delayed internal clock to pulse generation circuit 212. Pulse generation circuit 212 generates internal clock CLK_NF which serves as a pulse signal synchronized with the rising edge of the signal outputted from variable delay circuit 208, and outputs internal clock CLK_NF to clock select circuit 102.

Input/output replica circuit 214 reproduces, in a mimic manner, input buffer 202 and circuit characteristics since internal clocks CLK_PF and CLK_NF are generated until data DQ is outputted to data input/output terminal 18, and allocates, in a mimic manner, a delay quantity generated by these circuits to internal clock CLK_PF.

Phase comparator 216 compares the phase of internal clock FBCLK outputted from input/output replica circuit 214 with that of internal clock BUFFCLK_DLL after one or few cycles, and generates control signals UP and DOWN for increasing/decreasing the delay quantities of variable delay circuits 206 and 208 based on the phase difference. Delay control circuit 218 commands variable delay circuits 206 and 208 to connect or disconnect their respective delay units based on control signals UP and DOWN, thereby adjusting the delay quantities of variable delay circuits 206 and 208.

Figure 4:
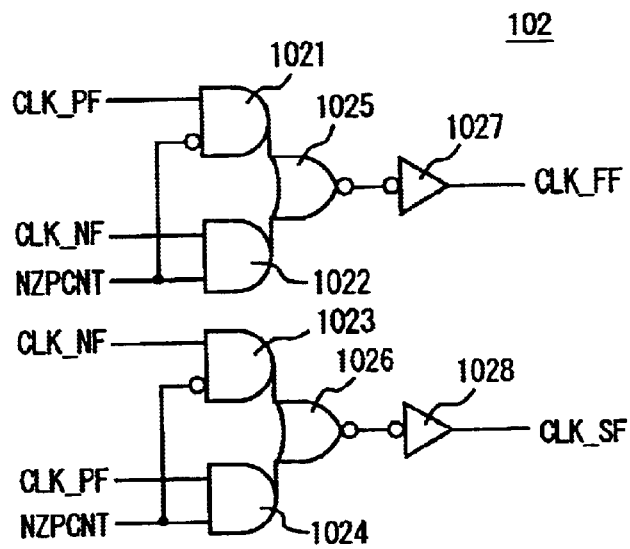
FIG. 4 is a circuit diagram showing the circuit configuration of a clock select circuit shown in FIG. 3.

FIG. 4 is a circuit diagram showing the circuit configuration of clock select circuit 102.

Referring to FIG. 4, clock select circuit 102 includes AND gates 1021 to 1024, NOR gates 1025 and 1026, and inverters 1027 and 1028.

Internal signal NZPCNT is a DC signal the level of which becomes L (logic Low) when the CAS latency is an integer and H (logic High) when the CAS latency is a half-integer, i.e., a fixed signal set by the CAS latency of semiconductor memory device 10 in this embodiment. Namely, when the CAS latency is 2.5, internal signal NZPCNT is fixed to H level, AND gates 1022 and 1024 are activated, and internal clocks CLK_FF and CLK_SF correspond to internal clocks CLK_NF and CLK_PF received from DLL circuit 100, respectively. When the CAS latency is 2.0, internal signal NZPCNT is fixed to L level, AND gates 1021 and 1023 are activated, and internal clocks CLK_FF and CLK_SF correspond to internal clocks CLK_PF and CLK_FF received from DLL circuit 100, respectively.

Figure 5:
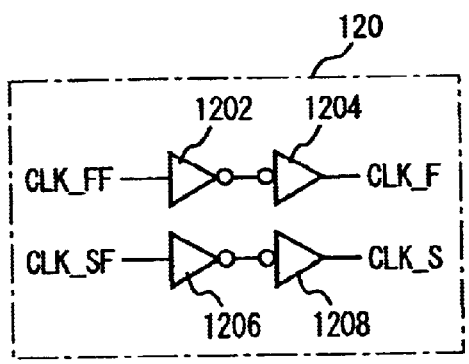
FIG. 5 is a circuit diagram showing the circuit configuration of a repeater shown in FIG. 2.

FIG. 5 is a circuit diagram showing the circuit configuration of repeater 120.

Referring to FIG. 5, repeater 120 is formed of inverters 1202 to 1208. Repeater 120 receives internal clock CLK_FF outputted from clock select circuit 102, and outputs a DLL clock CLK_F through inverters 1202 and 1204. In addition, repeater 120 receives internal clock CLK_SF outputted from clock select circuit 102, and outputs a DLL clock CLK_S through inverters 1206 and 1208.

Figure 6:
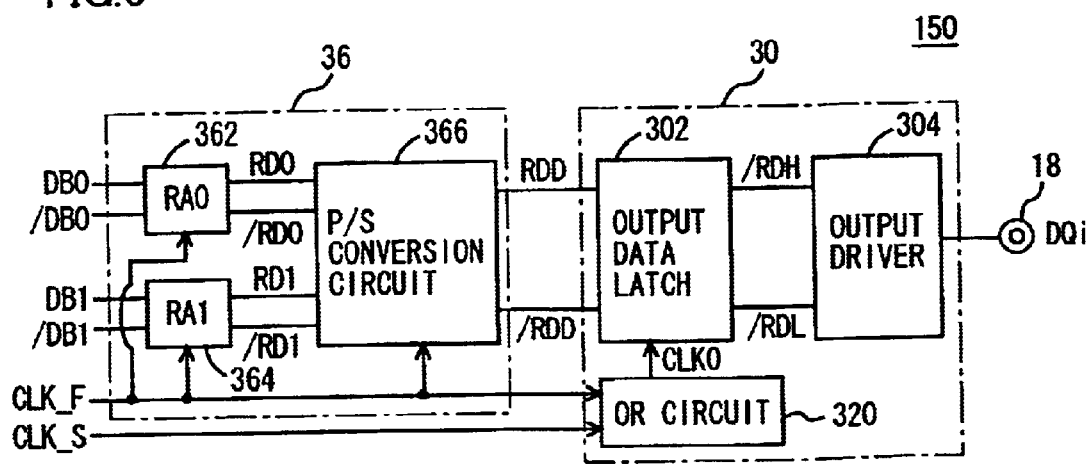
FIG. 6 is a functional block diagram for functionally describing the data output circuit shown in FIG. 2.

FIG. 6 is a functional block diagram for functionally describing data output circuit 150.

Referring to FIG. 6, data output circuit 150 includes a read amplifier & P/S conversion circuit 36 and an output buffer 30.

Read amplifier & P/S conversion circuit 36 includes amplification circuits 362 and 364, and a parallel/serial conversion circuit 366. Output buffer 30 includes an output data latch circuit 302, an output driver circuit 304 and an OR circuit 320.

Amplification circuits 362 and 364 are driven by DLL clock CLK_F. Amplification circuit 362 amplifies data read from memory cell array 52 to data bus pair DB0 and /DB0. Amplification circuit 364 amplifies data read from memory cell array 52 to data bus pair DB1 and /DB1 at the same timing as that of reading data to data bus pair DB0 and /DB0. Amplification circuits 362 and 364 output the amplified data to parallel/serial conversion circuit 366.

Parallel/serial conversion circuit 366 is driven by DLL clock CLK_F, orders data RD0 and /RD0 (complementary to each other and one-bit data) and RD1 and /RD1 received from amplification circuits 362 and 364, respectively, and outputs the data to output data latch circuit 302.

Output data latch circuit 302 operates in a half cycle synchronously with DLL clock CLKO received from OR circuit 320, takes in and latches data RDD and /RDD received from parallel/serial conversion circuit 366, and transfers data RDD and /RDD as data /RDH and /RDL to output driver circuit 304 in a half cycle. Output driver circuit 304 outputs data DQi to data input/output terminal 18 based on data /RDH and /RDL.

OR circuit 320 ORs DLL clock CLK_F with CLK_S, and outputs the operated clock as DLL clock CLKO to output data latch circuit 302.

DLL clock CLK_F which drives amplification circuits 362 and 364 and parallel/serial conversion circuit 366, is one of internal clocks CLK_PF and CLK_NF phase-adjusted by DLL circuit 100. Namely, one of internal clocks CLK_PF and CLK_NF which becomes H level at the initial output timing of the read data is selected as DLL clock CLK_F while considering the CAS latency of semiconductor memory device 10. Therefore, amplification circuits 362 and 364 and parallel/serial conversion circuits 366 which are driven by DLL clock CLK_F, are driven in a cycle from the initial output timing of the read data, read data of two bits from data bus pairs DB0 and /DB0 and DB1 and /DB1, order the data and output the data to output buffer 30.

Output data latch circuit 302 is activated by DLL clock CLKO in a half cycle given by means of OR of DLL clock CLK_F with CLK_S, and transfers data of two bits received from parallel/serial circuit 366 to output driver circuit 304 one bit by one bit in a half cycle in accordance with DLL clock CLKO. Output driver circuit 304 outputs the data transferred from output data latch circuit 302 to data input/output terminal 18.

As mentioned so far, according to semiconductor memory device 10 in the first embodiment, clock select circuit 102 is provided between DLL circuit 100 and repeaters 120 and clock select circuit 102 functions to select the DLL clock which is required to be appropriately selected according to the CAS latency. Due to this, it is unnecessary to provide select circuit of DLL clock according to the CAS latency in each of a plurality of data output circuits 150, making it possible to reduce the circuit area of the data output circuit zone and to reduce the area of semiconductor memory device 10.

Second Embodiment

In semiconductor memory device 10 in the first embodiment, clock select circuit 102 which is provided between DLL circuit 100 and repeaters 120 selects the internal clock based on the CAS latency. In a semiconductor memory device 11 in the second embodiment, by contrast, a clock select function is provided in a repeater which is provided on the wiring path of a clock signal delivered from DLL circuit 100 to data output circuits 150 and a DLL clock is generated by the clock select function.

Since the overall configuration of semiconductor memory device 11 in the second embodiment is equal to that of semiconductor memory device 10 in the first embodiment shown in FIG. 1, it will not be repeatedly described herein.

Figure 7:
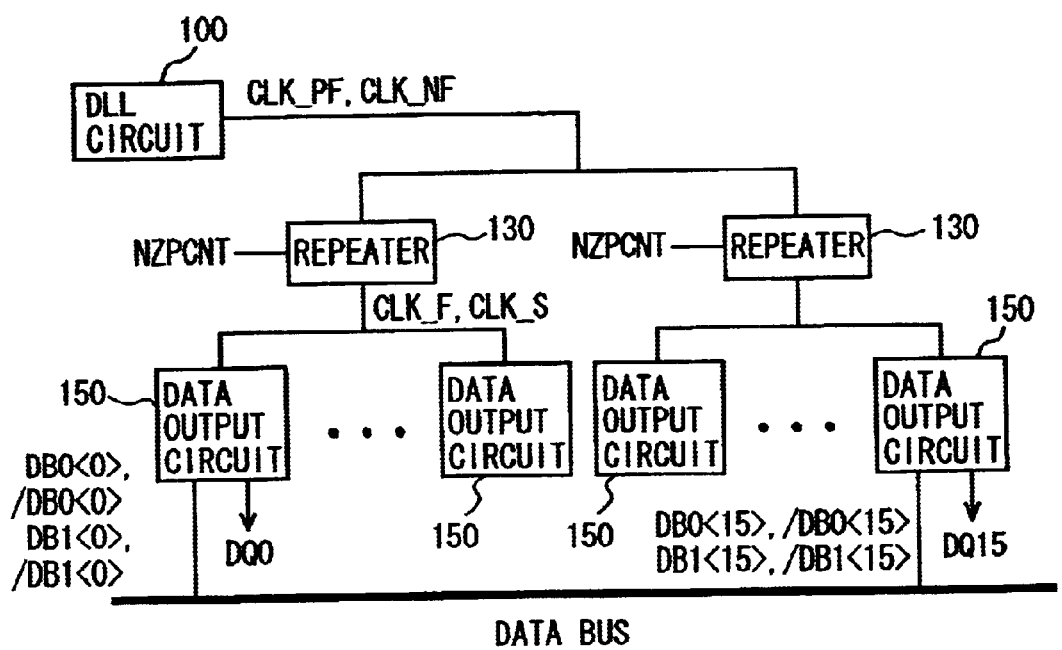
FIG. 7 is a schematic block diagram for conceptually describing the relationship between a DLL circuit and data output circuits in a semiconductor memory device according to a second embodiment.

FIG. 7 is a schematic block diagram for conceptually describing the relationship between DLL circuit 100 and data output circuits 150.

Referring to FIG. 7, repeaters 130 are arranged between DLL circuit 100 and data output circuits 150, and internal clocks CLK_PF and CLK_NF generated by DLL circuit 100 are inputted into repeater 130.

Since DLL circuit 100 and data output circuit 150 have been already described in the first embodiment, they will not be repeatedly described herein.

Repeater 130 receives internal clocks CLK_PF and CLK_NF outputted from DLL circuit 100, and converts internal clocks CLK_PF and CLK_NF into DLL clocks CLK_F and CLK_S based on the CAS latency of semiconductor memory device 11 and outputs DLL clocks CLK_F and CLK_S.

That is, based on internal signal NZPCNT which have different logic levels depending on whether the CAS latency is an integer or a half-integer, repeater 130 outputs internal clock CLK_NF as DLL clock CLK_F and outputs internal clock CLK_PF as DLL clock CLK_S when CAS latency is a half-integer, and outputs internal clock CLK_PF as DLL clock CLK_F and outputs internal clock CLK_NF as DLL clock CLK_S when the CAS latency is an integer.

Amplification circuits 362 and 364 and parallel/serial conversion circuit 366 in data output circuit 150 are driven by DLL clock CLK_F received from repeater 130, and output data latch circuit 302 in data output circuit 150 transfers read data read from the memory cell array to the data bus to output driver circuit 304 in a half cycle synchronously with DLL clock CLKO generated and given by means of OR of DLL clock CLK_F with CLK_S in OR circuit 320. Output driver circuit 304 outputs data DQ to data input/output terminal 18.

In semiconductor memory device 11 in the second embodiment, as in the case of semiconductor memory device 10 in the first embodiment, a signal path from DLL circuit 100 to data output circuits 150 has a tree structure in which repeaters 130 are arranged so as to prevent data output timing from greatly differing among a plurality of data output circuits 150. In addition, as in the case of repeater 120, one repeater 130 is arranged for eight or four data output circuits. In FIG. 7, one repeater 130 is arranged for the eight data output circuits.

Figure 8:
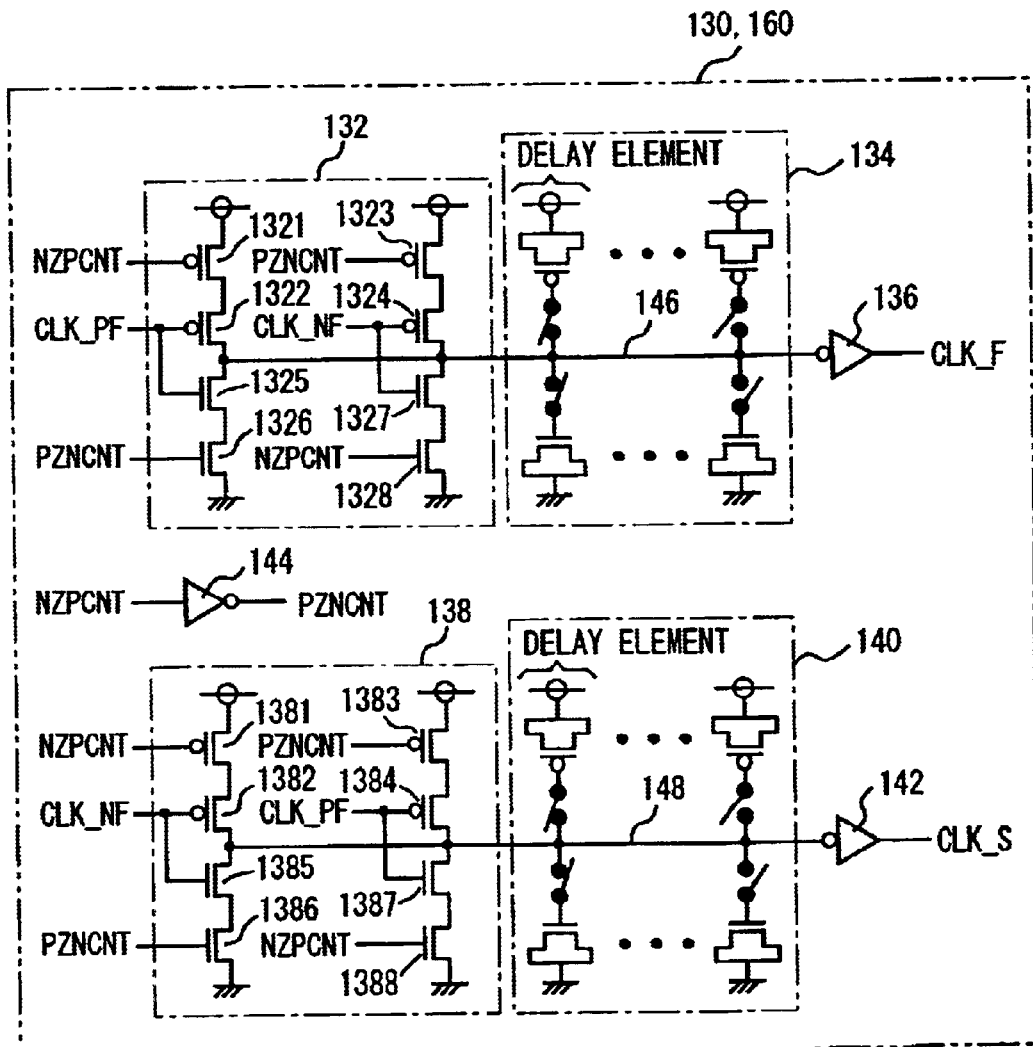
FIG. 8 is a circuit diagram showing the circuit configuration of a repeater shown in FIG. 7.

FIG. 8 is a circuit diagram showing the circuit configuration of repeater 130.

Referring to FIG. 8, repeater 130 includes clock select circuits 132 and 138, delay adjustment circuits 134 and 140, and inverters 136, 142 and 144.

Clock select circuit 132 includes P-channel MOS transistors 1321 to 1324 and N-channel MOS transistors 1325 to 1328. Clock select circuit 138 includes P-channel MOS transistors 1381 to 1384 and N-channel MOS transistors 1385 to 1388.

P-channel MOS transistors 1322 and 1384, and N-channel MOS transistors 1325 and 1387 receive internal clock CLK_PF at their gates. P-channel MOS transistors 1324 and 1382, and N-channel MOS transistors 1327 and 1385 receive internal clock CLK_NF at their gates.

P-channel MOS transistors 1321 and 1381, and N-channel MOS transistors 1328 and 1388 receive internal signal NZPCNT at their gates. P-channel MOS transistors 1323 and 1383, and N-channel MOS transistors 1326 and 1386 receive a signal PZNCNT inverted from internal signal NZPCNT by an inverter 144 at their gates.

Each of delay adjustment circuits 134 and 140 is provided to adjust the skew between DLL clocks CLK_F and CLK_S outputted from repeater 130. That is, as shown in FIG. 6, if DLL clock CLK_F is directly used by amplification circuits 362 and 364 and parallel/serial conversion circuit 366, the load capacitances of the circuits which use DLL clocks CLK_F and CLK_S differ and timing difference tAC may, therefore, possibly differ between the rise and fall of external clock EXTCLK. To adjust this, delay adjustment circuits 134 and 140 are provided individually in the output stages of DLL clocks CLK_F and CLK_S.

Referring back to FIG. 8, delay adjustment circuit 134 is constituted so that a plurality of delay elements, each of which is formed of a P-channel MOS transistor having a drain and a source both connected to a power supply node, an N-channel MOS transistor having a drain and a source both connected to a ground node and a switch which connects/disconnects the P-channel MOS transistor and the N-channel MOS transistor to/from a node 146, are connected between clock select circuit 132 and inverter 136. Likewise, delay adjustment circuit 140 is constituted so that a plurality of above-mentioned delay elements are connected between clock select circuit 138 and inverter 142.

The P-channel MOS transistor and the N-channel MOS transistor which are connected to node 146 or 148 when the switch is turned on, function as the capacitance elements of each delay element. By providing the P-channel MOS transistor and the N-channel MOS transistor, it is possible to delay a signal on node 146 or 148 whether the logic level of the signal is H or L. In addition, delay adjustment circuits 134 and 140 can adjust delay quantities depending on the number of the connected delay elements.

As already described above, internal signal NZPCNT is a signal the level of which is fixed to H or L level based on the CAS latency. When the CAS latency is a half-integer, internal signal NZPCNT is at H level. When the CAS latency is an integer, internal signal NZPCNT is at L level.

Therefore, in repeater 130, when the CAS latency is, for example, 2.5, internal signal NZPCNT is at H level and signal PZNCNT is at L level. Due to this, the inverter in the rear stage of clock select circuit 132 is activated and a signal which is inverted and amplified internal clock CLK_NF is outputted from clock select circuit 132. Further, the inverter in the rear stage of clock select circuit 138 is activated and a signal which is inverted and amplified internal clock CLK_PF is outputted from clock select circuit 138.

The skew between the signals is adjusted by delay adjustment circuits 134 and 140, and the signals are inverted by inverters 136 and 142, respectively. Finally, internal clock CLK_NF is outputted as DLL clock CLK_F and internal clock CLK_PF is outputted as DLL clock CLK_S.

Although not shown, so as to realize a function equal to delay adjustment circuits 130 and 140, a dummy gate which corresponds to the total capacitance of amplification circuit 362 or 364 and parallel/serial conversion circuit 366 may be arranged in each data output circuit 150 and DLL clock CLK_S may be used in data output circuit 150 through this dummy gate. By adopting such a configuration, it is also possible to decrease the skew between DLL clocks CLK_F and CLK_S and to ensure constant timing difference tAC irrespectively of the rise and fall of external clock EXTCLK.

If a signal path from the DLL circuit to the data output circuits is long, a buffer is often provided between the DLL circuit and the repeaters so as to shape a signal waveform. Such a buffer is arranged on the upper stage side of the repeaters and, one buffer is normally arranged for a plurality of repeaters on the signal path before the internal clock signal line is branched. Therefore, the above-mentioned internal clock select function can be provided in this buffer.

Figure 9:
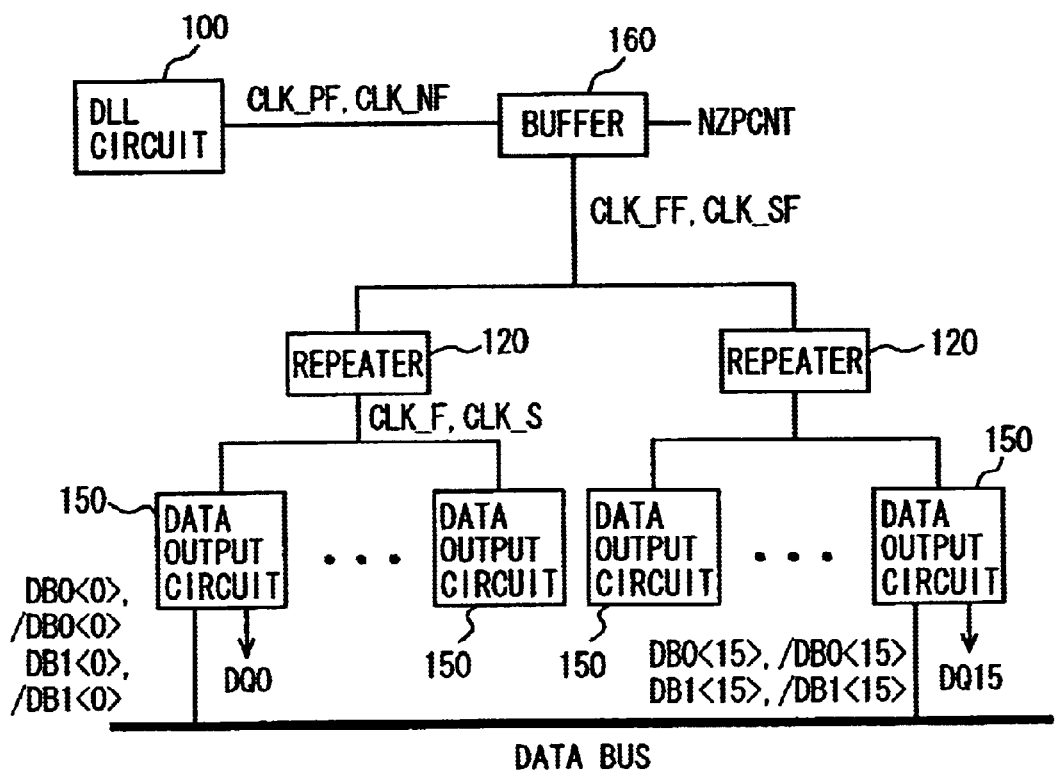
FIG. 9 is a schematic block diagram for conceptually describing the relationship between the DLL circuit and the data output circuits in the semiconductor memory device according to the second embodiment if a buffer is further provided between the DLL circuit and the repeaters.
Figure 10:
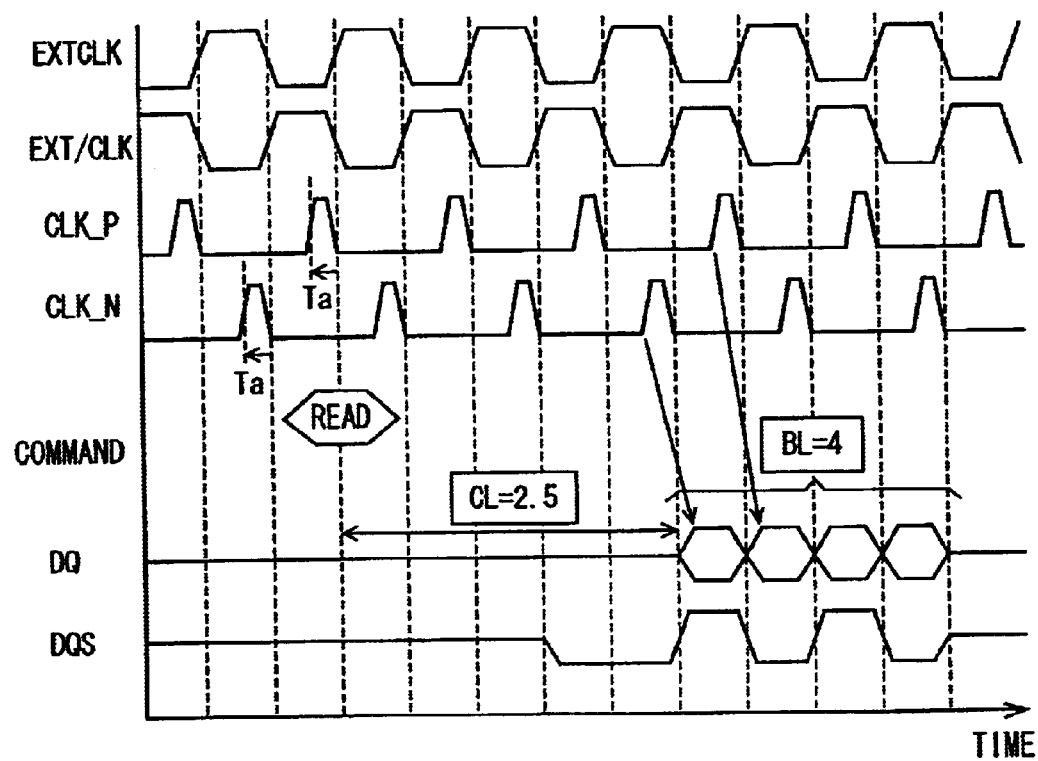
FIG. 10 is a timing chart showing the data output timing of a DDR SDRAM when data is read from the DDR SDRAM.
Figure 11:
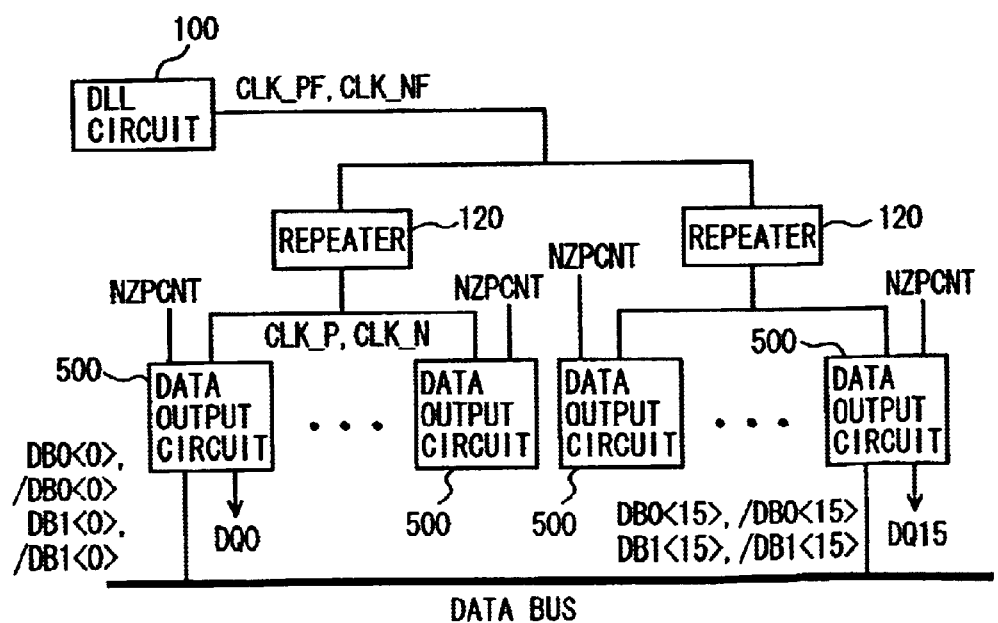
FIG. 11 is a schematic block diagram for conceptually describing the relationship between a DLL circuit and data output circuits in a conventional semiconductor memory device.
Figure 12:
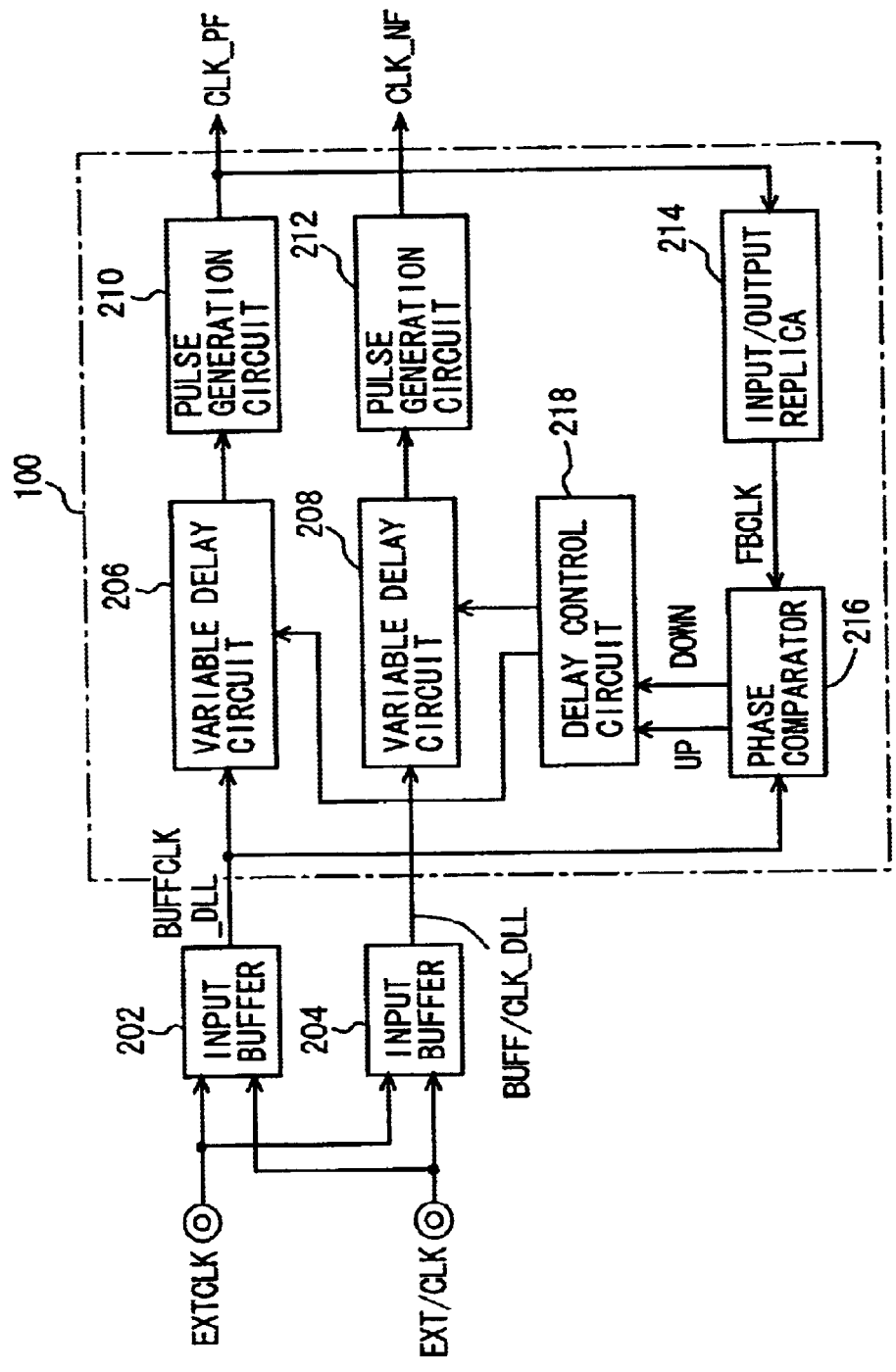
FIG. 12 is a functional block diagram for functionally describing the DLL circuit shown in FIG. 11.
Figure 13:
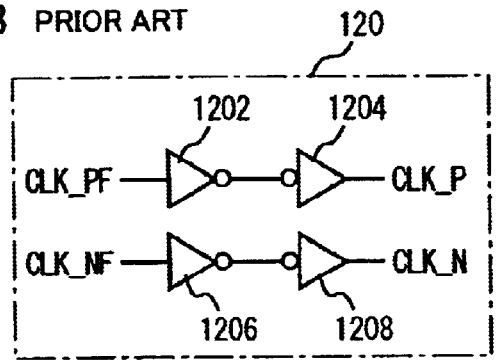
FIG. 13 is a circuit diagram showing the circuit configuration of a repeater shown in FIG. 11.
Figure 14:
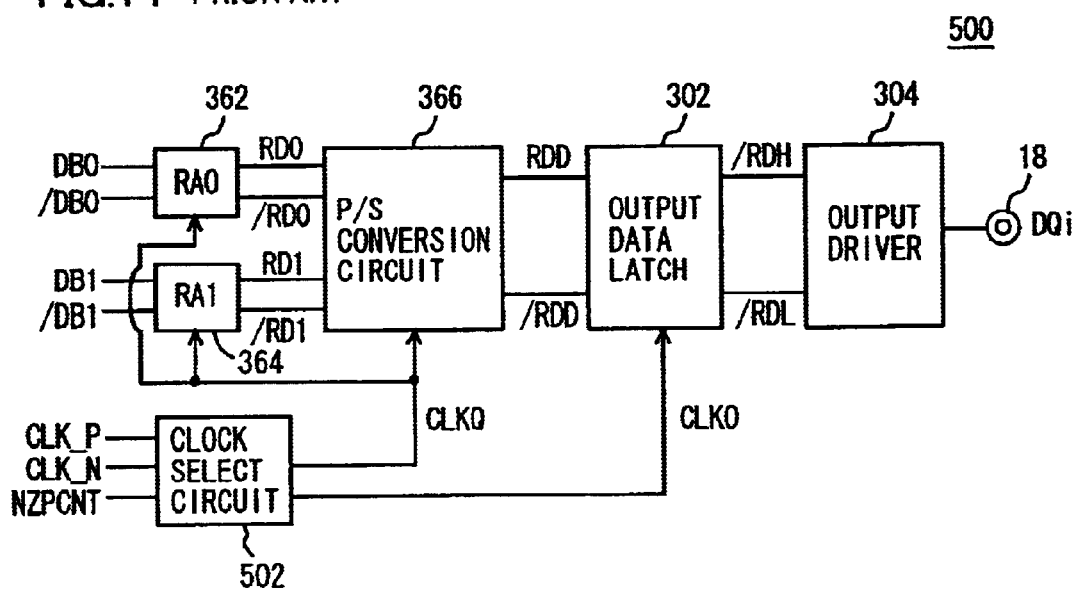
FIG. 14 is a functional block diagram for functionally describing the data output circuit shown in FIG. 11.
Figure 15:
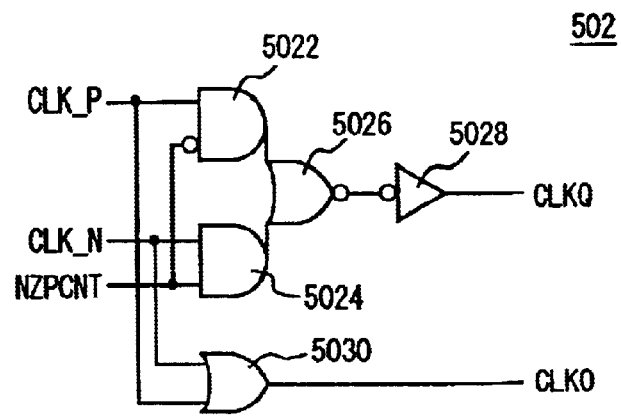
FIG. 15 is a circuit diagram showing the circuit configuration of a clock select circuit shown in FIG. 14.

FIG. 9 is a schematic block diagram for conceptually describing the relationship between the DLL circuit and the data output circuits if the buffer is provided between the DLL circuit and the repeaters so as to shape a signal waveform. FIG. 9 corresponds to the block diagram of FIG. 16 with reference to which the conventional art has been described.

Referring to FIG. 9, a buffer 160 which has an internal clock select function, is provided between DLL circuit 100 and repeaters 120. Since DLL circuit 100, repeaters 120 and data output circuits 150 have been already described above, they will not be repeatedly described herein.

Buffer 160 receives internal clocks CLK_PF and CLK_NF outputted from DLL circuit 100, converts internal clocks CLK_PF and CLK_NF into clocks CLK_FF and CLK_SF, and outputs clocks CLK_FF and CLK_SF to each repeater 120.

That is, buffer 160 outputs clocks as follows based on internal signal NZPCNT which have different logic levels depending on whether the CAS latency is an integer or a half-integer. When the CAS latency is a half-integer, buffer 160 outputs internal clock CLK_NF as DLL clock CLK_FF and outputs internal clock CLK_PF as DLL clock CLK_SF to repeater 120. When the CAS latency is an integer, buffer 160 outputs internal clock CLK_PF as DLL clock CLK_FF and outputs internal clock CLK_NF as DLL clock CLK_SF to repeater 120.

The circuit configuration of buffer 160 is equal to that of repeater 130 shown in FIG. 8 except that outputted DLL clocks CLK_F and CLK_S shown in FIG. 8 are replaced by DLL clocks CLK_FF and CLK_SF, respectively. Therefore, the internal circuit configuration of buffer 160 will not be repeatedly described herein.

Figure 16:
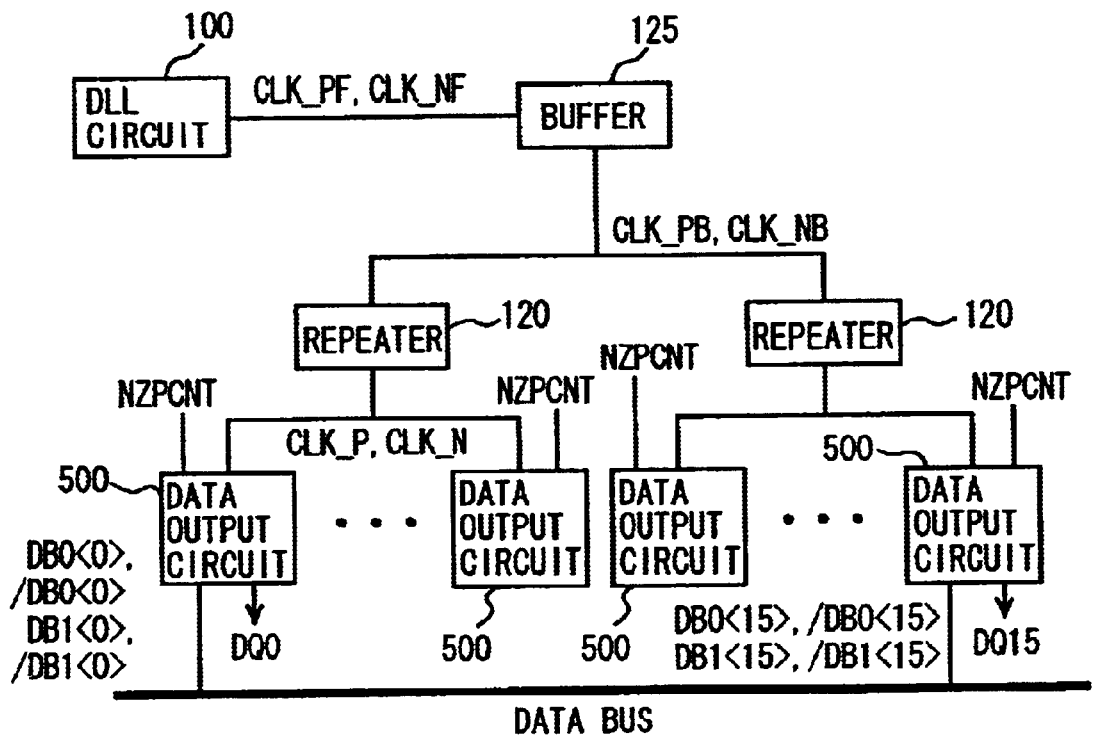
FIG. 16 is a schematic block diagram for conceptually describing the relationship between the DLL circuit and the data output circuits in the conventional semiconductor memory device if a buffer is further provided between the DLL circuit and the repeaters.
Figure 17:
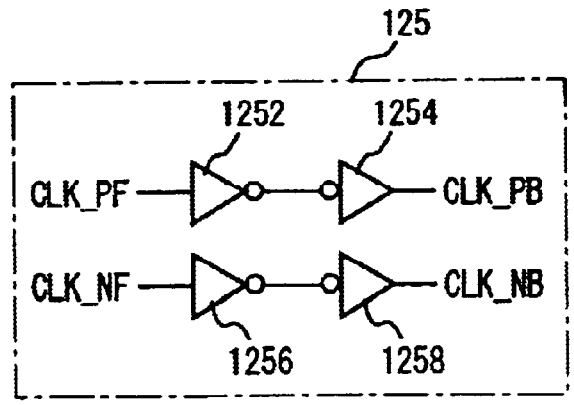
FIG. 17 is a circuit diagram showing the circuit configuration of the buffer shown in FIG. 16.

The repeaters are denoted as repeaters 120 in FIG. 9 because FIG. 9 is made correspond to the functional block diagram of FIG. 16 with reference to which the conventional art has been described. Repeaters 130 may be used in place of repeaters 120.

As mentioned so far, according to semiconductor memory device 11 in the second embodiment, the function of selecting the DLL clock which is required to be appropriately selected according to the CAS latency is provided in repeater 130 or buffer 160 arranged between DLL circuit 100 and data output circuits 150. Due to this, it is unnecessary to provide the DLL clock select function according to the CAS latency in each of a plurality of data output circuits 150, thereby making it possible to reduce the circuit area of the data output circuit zone and realize the reduction of the area of semiconductor memory device 11.

Furthermore, according to semiconductor memory device 11 in the second embodiment, the number of passage gates provided before the internal clocks outputted from DLL circuit 100 are used as the DLL clocks in data output circuits 150 is decreased by two and the delay quantities from the internal clocks to the DLL clocks are decreased. Therefore, it is possible to decrease the backward amount of a DLL clock relative to an external clock, for the DLL clock to be generated stably from the external clock, and to thereby realize the stabilization of the operation of the overall semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device inputting and outputting data synchronously with rise and fall of an external clock, comprising:
    a memory cell array storing data;
    a clock generation circuit generating first and second internal clocks corresponding to the rise and the fall of said external clock, respectively, synchronously with said external clock;
    at least one clock select circuit selecting one of said first and second internal clocks as a first operation clock and selecting the other one of said first and second internal clocks as a second operation clock in accordance with the number of cycles from receiving a command to read the data from said memory cell array until starting to output the read data read from said memory cell array to an outside;
    at least one signal recovery circuit recovering a signal outputted from said clock select circuit; and
    at least one data output circuit receiving said first and second operation clocks outputted from said signal recovery circuit, and outputting said read data to the outside synchronously with said first and second operation clocks.

2. The semiconductor memory device according to claim 1, wherein
    said clock select circuit sets said first internal clock as said first operation clock and sets said second internal clock as said second operation clock when said number of cycles is an integer,
    said clock select circuit sets said second internal clock as said first operation clock and sets said first internal clock as said second operation clock when said number of cycles is a half-integer, and
    said data output circuit takes in said read data synchronously with said first operation clock, and outputs said read data to the outside synchronously with said first and second operation clocks.

3. The semiconductor memory device according to claim, wherein
    a plurality of said data output circuits are provided,
    each said at least one signal recovery circuit receives said first and second operation clocks from said clock select circuit,
    each of said plurality of data output circuits receives said first and second operation clocks from any said at least one signal recovery circuit, and
    said clock select circuit, said at least one signal recovery circuit and said plurality of data output circuits are provided in a hierarchical tree structure.

4. The semiconductor memory device according to claim 1, wherein
    said clock select circuit is provided in the vicinity of said clock generation circuit.

5. The semiconductor memory device according to claim 1, wherein
    said clock select circuit is included in said signal recovery circuit.

6. The semiconductor memory device according to claim 5, wherein
    said signal recovery circuit further adjusts a phase difference between said first and second operation clocks.

7. The semiconductor memory device according to claim 6, wherein
    said signal recovery circuit includes:
        a first delay adjustment circuit delaying said first operation clock; and
        a second delay adjustment circuit delaying said second operation clock, and
        said first and second delay adjustment circuits adjust delay quantities of said first and second operation clocks, respectively, to thereby adjust the phase difference between said first and second operation clocks.

8. The semiconductor memory device according to claim 1, wherein
    said signal recovery circuit is a repeater.

9. The semiconductor memory device according to claim 1, wherein
    said signal recovery circuit is a buffer shaping a signal waveform.

10. The semiconductor memory device according to claim 1, wherein said data output circuit includes a mimic circuit for allocating a predetermined delay amount to said second operation clock received from said signal recovery circuit, and said data output circuit takes in said read data synchronously with said first operation clock, and outputs said read data to the outside synchronously with said first operation clock and the second operation clock allocated the predetermined delay amount by said mimic circuit.

11. The semiconductor memory device according to claim 1, wherein said clock generation circuit includes:

a first input buffer circuit receiving an external reference clock formed of said external clock and a complementary clock to said external clock, and generating a third internal clock;

a second input buffer circuit receiving said external reference clock, and generating a fourth internal clock complementary to said third internal clock;

a first variable delay circuit delaying said third internal clock, and thereby generating said first internal clock;

a second variable delay circuit delaying said fourth internal clock, and thereby generating said second internal clock;

a mimic delay circuit further delaying said first internal clock by predetermined time, and thereby generating a fifth internal clock;

a phase comparison circuit comparing a phase of said third internal clock with a phase of said fifth internal clock; and a delay control circuit controlling delay quantities of said first and second variable delay circuits, respectively, based on a phase comparison result of said phase comparison circuit.

\* \* \* \* \*

UNITED STATES PATENT AND TRADEMARK OFFICE
CERTIFICATE OF CORRECTION

PATENT NO. : 6,707,758 B2
DATED : March 16, 2004
INVENTOR(S) : Takashi Kono

It is certified that error appears in the above-identified patent and that said Letters Patent is hereby corrected as shown below:

Column 16,
Line 19, after claim insert -- 1 --

Signed and Sealed this

Seventh Day of December, 2004

JON W. DUDAS
*Director of the United States Patent and Trademark Office*